(12) United States Patent
Shibata et al.

(10) Patent No.: US 6,969,893 B2
(45) Date of Patent: Nov. 29, 2005

(54) SEMICONDUCTOR DEVICE AND PORTABLE ELECTRONIC APPARATUS

(75) Inventors: Akihide Shibata, Nara (JP); Hiroshi Iwata, Nara (JP); Seizo Kakimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 10/416,856

(22) PCT Filed: Nov. 13, 2001

(86) PCT No.: PCT/JP01/09887

§ 371 (c)(1),
(2), (4) Date: May 16, 2003

(87) PCT Pub. No.: WO02/41401

PCT Pub. Date: May 23, 2002

(65) Prior Publication Data

US 2004/0026743 A1   Feb. 12, 2004

(30) Foreign Application Priority Data

Nov. 16, 2000 (JP) .............................. 2000-349675

(51) Int. Cl.⁷ ............................................. H01L 29/76
(52) U.S. Cl. ...................... 257/368; 257/368; 257/369; 257/371; 257/374; 257/506; 257/392; 257/314; 257/355; 257/341; 257/401; 257/296; 257/390; 257/342; 257/391; 257/510; 438/199; 438/221; 438/223
(58) Field of Search ................................ 257/368, 369, 257/371, 374, 506, 392, 314, 355, 341, 342, 257/401, 296, 390, 391, 510

(56) References Cited

U.S. PATENT DOCUMENTS

| | | | |
|---|---|---|---|
| 6,040,610 A | 3/2000 | Noguchi et al. | |
| 6,143,593 A | * 11/2000 | Augusto | ..................... 438/199 |
| 6,255,704 B1 | 7/2001 | Iwata et al. | |

FOREIGN PATENT DOCUMENTS

| | | |
|---|---|---|
| EP | 0 725 443 A1 | 8/1996 |
| EP | 0 951 071 A1 | 10/1999 |

(Continued)

OTHER PUBLICATIONS

Wolf, "Silicon Processing for VLSI Era, vol. 3— Submicron MOSFET," 1990, Lattice Press, p. 367-383.*
Kakimoto et al., IEEE, pp. 459-462 (1996).

*Primary Examiner*—Steven Loke
*Assistant Examiner*—Junghwa Im
(74) *Attorney, Agent, or Firm*—Birch, Stewart, Kolasch & Birch, LLP

(57) ABSTRACT

There is provided a semiconductor device of low power consumption and high reliability having DTMOS' and substrate-bias variable transistors, and portable electronic equipment using the semiconductor device. On a semiconductor substrate (11), trilayer well regions (12, 14, 16; 13, 15, 16) are formed, and DTMOS' (29, 30) and substrate-bias variable transistors (27, 28) are provided in the shallow well regions (16, 17). Large-width device isolation regions (181, 182, 183) are provided at boundaries forming PNP, NPN or NPNP structures, where a small-width device isolation region (18) is provided on condition that well regions on both sides are of an identical conductive type. Thus, a plurality of well regions of individual conductive types where substrate-bias variable transistors (27, 28) of individual conductive types are provided can be made electrically independent of one another, allowing the power consumption to be reduced. Besides, the latch-up phenomenon can be suppressed.

8 Claims, 13 Drawing Sheets

FOREIGN PATENT DOCUMENTS

| | | |
|---|---|---|
| JP | 59-84572 A | 5/1984 |
| JP | 6-216346 A | 8/1994 |
| JP | 10-22462 A | 1/1998 |
| JP | 10-163342 A | 6/1998 |
| JP | 10-199968 A | 7/1998 |
| JP | 10-340998 A | 12/1998 |
| JP | 11-289060 A | 10/1999 |
| JP | 2000-82815 A | 3/2000 |

* cited by examiner

SEMICONDUCTOR DEVICE AND PORTABLE ELECTRONIC APPARATUS

This application is the national phase under 35 U.S.C. § 371 of PCT International Application No. PCT/JP01/09887 which has an International filing date of Nov. 13, 2001, which designated the United States of America.

TECHNICAL FIELD

The present invention relates to semiconductor devices and portable electronic equipment, and more specifically to a semiconductor device having a dynamic threshold transistor and a substrate-bias variable transistor, as well as portable electronic equipment using this semiconductor device.

BACKGROUND ART

In order to decrease power consumption in CMOS (Complementary Metal Oxide Semiconductor) circuits using MOSFETs (Metal Oxide Semiconductor Field Effect Transistors), it is most effective to lower the power supply voltage. However, merely lowering the power supply voltage would cause the drive current of MOSFETs to lower, resulting in a lower operating speed of the circuit. This phenomenon is known to become noticeable as the power supply voltage becomes a triple or less of the threshold of the transistor. Although this phenomenon can be prevented by lowering the threshold, doing so would give rise to a problem of increases in off-leak current of MOSFETs. Therefore, the lower limit of the threshold is defined within a range over which the above problem does not occur. This in turn defines the limits of power consumption reduction since the lower limit of the threshold corresponds to the lower limit of the power supply voltage.

Conventionally, there has been proposed a dynamic-threshold operation transistor (hereinafter, referred to as DTMOS) which employs a bulk substrate for alleviation of the above-mentioned problem (Japanese Patent Laid-Open Publications HEI 10-22462, Novel Bulk Threshold Voltage MOSFET (B-DTMOS) with Advanced Isolation (SITOS) and Gate to Shallow-Well Contact (SSS-C) Processes for Ultra Low Power Dual Gate CMOS, H. Kotaki et al., IEDM Tech. Dig., p. 459, 1996). The aforementioned DTMOS has a characteristic of a capability of high drive current with low power supply voltage by virtue of its effective threshold lowering in an ON state. The reason why the effective threshold of DTMOS lowers in the ON state is that the gate electrode and the well region are electrically short-circuited.

The principle of operation of the N-type DTMOS is explained below. It is noted that the P-type DTMOS operates similarly with the polarity reversed. In the N-type MOSFET, when the gate electrode voltage is at a low level (in an OFF state), the P-type well region voltage is also at a low level, the effective threshold has no differences from normal MOSFETs. Therefore, the off current value (off-leak) is the same as in the case of normal MOSFETs.

On the other hand, when the gate electrode voltage is at a high level (in an ON state), the P-type well region voltage is also at a high level, the effective threshold lowers by the substrate-bias effect, so that the drive current increases compared with those of normal MOSFETs. Therefore, large drive current can be obtained with low power supply voltage while low leak current is maintained.

In a DTMOS, the gate electrode and the well region are electrically short-circuited. Therefore, as the gate electrode voltage changes, the well voltage also changes similarly. This accordingly requires the well region of each DTMOS to be mutually electrically isolated from the well regions of its neighboring MOSFETs. For this reason, the well region is made up of a shallow well region and a deep well region which are different in polarity from each other. Furthermore, the shallow well regions of the respective DTMOS' are electrically isolated from one another by a device isolation region.

As a conventional method for suppressing off-leaks in low voltage drive and still obtaining high drive current, there has been a method in which the well-bias voltage is changed between standby and active states (Japanese Patent Laid-Open Publications HEI 6-216346 and 10-340998).

Hereinafter, a MOSFET in which in which the well bias is changed between standby and active states will be expressed as substrate-bias variable transistor.

The principle of operation of the N-type substrate-bias variable transistor is explained below. It is noted that the P-type substrate-bias variable transistor operates similarly with the polarity reversed. In an N-type substrate-bias variable transistor, when the circuit is in an active state, a 0 V or positive voltage (with a source voltage referenced) is applied from a bias generation circuit to the P-type well region. With a positive voltage applied to the P-type well region, the effective threshold lowers due to a substrate-bias effect, and the drive current increases as compared with the case of normal MOSFETs. When the circuit is in a standby state, on the other hand, a negative voltage is applied from the bias generation circuit to the P-type well region. As a result of this, the effective threshold increases due to the substrate-bias effect, and the off-leak decreases as compared with normal MOSFETs or DTMOS'.

Generally, in a circuit using substrate-bias variable transistors, whether the active state or the standby state is effectuated is selected every circuit block. This is because providing the bias generating circuit for each device causes the number of devices and the circuit area to increase considerably. From these reasons, the P-type well region of an N-type MOSFET is common within a circuit block (the case is the same with the N-type well region of a P-type MOSFET). Accordingly, in a circuit block which is in an active state, a 0 V or positive voltage is applied to the well regions of all the N-type MOSFETs, so that the off-leak increases as compared with normal MOSFETs or DTMOS' (the case is the same also with the P-type MOSFETs).

In the circuit using substrate-bias variable transistors, the MOSFETs have to share a well region. For this purpose, the depth of the bottom face of the device isolation region is set deeper than the depth of the junction between the source regions and drain regions of the MOSFETs and their shallow well region and, at the same time, shallower than the depth of the lower end of the well region.

There has been disclosed a technique in which the DTMOS and the substrate-bias variable transistor are combined together to make the best of their respective advantages (Japanese Patent Laid-Open Publication HEI 10-340998).

FIG. 11 shows a cross-sectional view of a device fabricated by this technique. Referring to FIG. 11, there are shown, with reference numerals having the following denotations, a semiconductor P-type substrate 311, an N-type deep well region 312, a P-type deep well region 313, an N-type shallow well region 314, a P-type shallow well region 315, a device isolation region 316, an N-type MOSFET source region 317, an N-type MOSFET drain region 318, a P-type MOSFET source region 319, a P-type MOS- FET drain region 320, an N⁺ diffusion layer 321 for providing contact with an N-type shallow well region, a P⁺ diffusion layer 322 for providing contact with a P-type shallow well region, a gate insulator 323, a gate electrode 324, a P-type substrate-bias variable transistor 325, an N-type substrate-bias variable transistor 326, an N-type DTMOS 327, a P-type DTMOS 328, a well-bias input 329 for the P-type substrate-bias variable transistor, a well-bias input 330 for the N-type substrate-bias variable transistor, and a fixed bias input 331 for the P-type deep well region. In addition, although not shown, the gate electrode 324 and the P-type shallow well region 315 are electrically short-circuited in the N-type DTMOS 327, and the gate electrode 324 and the N-type shallow well region 314 are electrically short-circuited in the P-type DTMOS 328.

In the DTMOS' 327 and 328, the voltages of the shallow well regions 314 and 315 change with the voltage of the gate electrode 324. In order to prevent changes of the voltages of the shallow well regions 314 and 315 from affecting shallow well regions 314 and 315 of other devices, deep well regions 313 and 312 opposite in conductive type to the shallow well regions 314 and 315 are formed under those shallow well regions 314 and 315. Moreover, a device isolation region 316 is formed at enough depth to electrically isolate shallow well regions 314 and 315 of mutually neighboring devices. By doing so, the shallow well regions 314 and 315 are electrically isolated from shallow well regions 314 and 315 of neighboring devices. Meanwhile, shallow well regions of the substrate-bias variable transistors 326 contained in one circuit block have to be provided in common. Therefore, under the P-type shallow well regions 315 of the N-type substrate-bias variable transistors 326 in FIG. 11, is formed the P-type deep well region 313, which is integrated with a P-type shallow well region 315 to form a common well region. To this P-type common well region 313, 315, a voltage that differs between active and standby states is given via the well-bias input 330 for the N-type substrate-bias variable transistor 326. In order to prevent any effects on devices of other circuit blocks or DTMOS portion, the N-type deep well region 312 is formed further deeper in the substrate, by which the P-type deep well region 313 is electrically isolated. Under the shallow well region 314 of the P-type substrate-bias variable transistor 325 in FIG. 11, is formed the N-type deep well region 312, which is integrated with the N-type shallow well region 314 to form a common well region 312, 314. To this N-type common well region 312, 314, a voltage that differs between active and standby states is given via the well-bias input 329 for the P-type substrate-bias variable transistor 325.

FIGS. 12 and 13 show the procedure of forming the deep well regions 312, 313 of this conventional semiconductor device. As shown in FIG. 12, with photoresist 332 used as a mask, dopant injection for forming the P-type deep well region 313 is performed, and then dopant injection for forming the N-type deep well region 312 further deeper is performed. Next, as shown in FIG. 13, with the photoresist 332 used as a mask, dopant injection for forming the N-type deep well region 312' is performed. In this case, the depth of the N-type deep well region 312' is set to a level similar to the depth of the P-type deep well region 313. By these steps, the N-type deep well regions 312 and 312' are integrated together, by which the P-type deep well region 312 is electrically isolated.

In this way, the substrate-bias variable transistors 325, 326 and the DTMOS' 327, 328 are formed on the same substrate 311, making it possible to realize a circuit making the best of their respective advantages.

As shown in FIG. 11, in the conventional semiconductor device in which the DTMOS' 327, 328 and the substrate-bias variable transistors 325, 326 are combined together (Japanese Patent Laid-Open Publication HEI 10-340998), although the P-type deep well regions 313, 313, can be electrically isolated, the N-type deep well region 312 is common within one substrate 311. Therefore, although the circuit block of the N-type substrate-bias variable transistors 326, 326, . . . can be formed plurally within the same substrate 311, the circuit block of the P-type substrate-bias variable transistor 325, . . . cannot be formed plurally. For this reason, the circuit block of the P-type substrate-bias variable transistors 325, cannot be divided properly into active circuit blocks and standby circuit blocks. For example, when only part of the P-type substrate-bias variable transistors 325, 325, . . . need to be put into active state, the entirety of the P-type substrate-bias variable transistors 325, 325, . . . would come into an active state, causing the leak current to increase. As a result, the power consumption would increase.

Also, the conventional semiconductor device, in which the N-type deep well regions 312 are integrated together within the substrate 311, has a PN junction of a large area comparable to the area of the whole substrate 311. That is, a very large electrostatic capacity is parasitically present. Therefore, changing over between active and standby states in a circuit block of the P-type substrate-bias variable transistors 325, 325, . . . causes the bias of the whole N-type deep well region 312 to change, which in turn causes large amounts of charges to be charged and discharged. As a result, the power consumption increases.

Furthermore, in the foregoing semiconductor device, putting the P-type substrate-bias variable transistors 325, 325, . . . into the active state (i.e., giving a voltage lower than the power supply voltage to the N-type deep well region 312) makes it more likely that a latch-up phenomenon is induced. In an NPNP type structure having routes passing through the N-type shallow well region 314 of the P-type DTMOS 328, the P-type deep well region 313, the N-type deep well region 312 and the P-type shallow well region 315 of the N-type DTMOS 327, a case (undershoot) is discussed where a bias lower than ground voltage is applied to the N-type shallow well region 314 of the P-type DTMOS 328. In the DTMOS 328, in which the gate electrode 324 and the shallow well region 314 are electrically connected to each other, it can occur that a bias not more than the ground voltage is applied to the N-type shallow well region 314 of the P-type DTMOS 328 through the gate electrode 324. In this case, a forward voltage is applied to the junction between the N-type shallow well region 314 of the P-type DTMOS 328 and the P-type deep well region 313, so that electrons are injected into the P-type deep well region 313. The electrons injected into the P-type deep well region 313 reach the N-type deep well region 312, causing the voltage of the N-type deep well region 312 to decrease. With the voltage of the N-type deep well region 312 decreased, holes are injected from the P-type shallow well region 315 of the N-type DTMOS 327 into the N-type deep well region 312. The holes injected into the N-type deep well region 312 reach the P-type deep well region 313, causing the voltage of the P-type deep well region 313 to increase. With the voltage of the P-type deep well region 313 increased, electrons injected from the N-type shallow well region 314 of the P-type DTMOS 328 into the P-type deep well region 313 increase more and more. Through iterations of these steps (with a positive feedback applied), an abnormal current flow in the NPNP structure, giving rise to a latch-up phenomenon. In this connection, if a voltage lower than the power supply voltage has been applied to the N-type deep well region 312 from the beginning (i.e., if the P-type substrate-bias variable transistor 325 has been in an active state), the latch-up phenomenon is more likely to occur. Further, also when the P-type substrate-bias variable transistor 325 comes into a standby state (i.e., also when a voltage higher than the power supply voltage is applied to the N-type deep well region 312), it become more likely that a latch-up phenomenon is induced. In this case, a large inverse-bias is applied to the junction between the P-type shallow well region 315 of the N-type DTMOS 327 and the N-type deep well region 312, as well as to the junction between the P-type deep well region 313 and the N-type deep well region 312. This causes a punch-through to occur between the P-type shallow well region 315 of the N-type DTMOS 327 and the P-type deep well region 313, triggering the occurrence of a latch-up phenomenon in the NPNP structure. As to the route of the latch-up, in addition to the above-mentioned one, such an NPNP structure may also be mentioned as one including a route which passes the drain region 318 of the N-type DTMOS 327, the P-type shallow well region 315 of the N-type DTMOS 327, the N-type deep well region 312 and the P-type deep well region 313. Thus, largely changing bias of the N-type deep well region 312 makes it difficult to control the latch-up phenomenon. As a result, the device reliability deteriorates.

DISCLOSURE OF THE INVENTION

The present invention having been accomplished with a view to solving these problems, it is therefore an object of the invention to provide a low-power-consumption, high-reliability semiconductor device having DTMOS' and substrate-bias variable transistors, as well as portable electronic equipment using the semiconductor device.

In order to achieve the above object, according to a first aspect of the present invention, there is provided a semiconductor device comprising:

a semiconductor substrate;

a first-conductive-type first-deepest well region formed in the semiconductor substrate;

a first-conductive-type second-deepest well region formed on the first-conductive-type first-deepest well region;

a second-conductive-type shallow well region formed on the first-conductive-type second-deepest well region;

a first-conductive-type dynamic threshold transistor which is formed on the second-conductive-type shallow well region and in which a gate electrode and the second-conductive-type shallow well region are electrically connected to each other;

a second-conductive-type second-deepest well region formed on the first-conductive-type first-deepest well region;

a second-conductive-type shallow well region formed on the second-conductive-type second-deepest well region;

a first-conductive-type field effect transistor formed on the second-conductive-type shallow well region;

an input terminal which is formed on the second-conductive-type shallow well region and which serves for changing a substrate bias of the first-conductive-type field effect transistor;

a second-conductive-type first-deepest well region formed in the semiconductor substrate;

a second-conductive-type second-deepest well region formed on the second-conductive-type first-deepest well region;

a first-conductive-type shallow well region formed on the second-conductive-type second-deepest well region;

a second-conductive-type dynamic threshold transistor which is formed on the first-conductive-type shallow well region and in which a gate electrode and the first-conductive-type shallow well region are electrically connected to each other;

a first-conductive-type second-deepest well region formed on the second-conductive-type first-deepest well region;

a first-conductive-type shallow well region formed on the first-conductive-type second-deepest well region;

a second-conductive-type field effect transistor formed on the first-conductive-type shallow well region;

an input terminal which is formed on the first-conductive-type shallow well region and which serves for changing a substrate bias of the second-conductive-type field effect transistor;

device isolation regions which are deeper than a depth of a junction between the first-conductive-type second-deepest well region and the second-conductive-type shallow well region and which are shallower than a depth of a junction between the first-conductive-type first-deepest well region and the second-conductive-type second-deepest well region; and device isolation regions which are deeper than a depth of a junction between the second-conductive-type second-deepest well region and the first-conductive-type shallow well region and which are shallower than a depth of a junction between the second-conductive-type first-deepest well region and the first-conductive-type second-deepest well region.

Herein, the terms, "first conductive type," refer to P type or N type. The terms, "second conductive type," refer to N type when the first conductive type is P type, or to P type when the first conductive type is N type.

The semiconductor device of this invention is a semiconductor device including dynamic threshold transistors and substrate-bias variable transistors, i.e., field effect transistors, in which a plurality of well regions of individual conductive types where substrate-bias variable transistors of individual conductive types are provided are made electrically independent of one another by tri-layer well regions and device isolation regions of the above-described depths.

Therefore, according to this invention, the second-conductive-type well region in which the first-conductive-type field effect transistor is provided can easily be isolated from the other second-conductive-type well regions. Further, the first-conductive-type well region in which the second-conductive-type field effect transistor is provided can easily be isolated from the other first-conductive-type well regions.

Consequently, according to this invention, any arbitrary number of circuit blocks of substrate-bias variable transistors can be formed, and the circuit blocks can properly be divided into circuit blocks that should be put into the active state and circuit blocks that should be put into the standby state, so that the power consumption of the semiconductor device can be reduced.

Also, according to the invention, the PN junction area between well regions where substrate-bias variable transistors are provided and well regions of opposite conductive type can be reduced as compared with the prior art, so that the power consumption of the semiconductor device can be reduced.

Furthermore, since the voltage for the deep well regions of the part where the dynamic threshold transistor is provided can be fixed, it becomes easily attainable to suppress the latch-up phenomenon.

One embodiment includes in a plural quantity at least either one of a first-conductive-type circuit block or a second-conductive-type circuit block, the first-conductive-type circuit block comprising: the second-conductive-type second-deepest well region formed on the first-conductive-type first-deepest well region; the second-conductive-type shallow well region formed on the second-conductive-type second-deepest well region; the first-conductive-type field effect transistor formed on the second-conductive-type shallow well region; and the input terminal which is formed on the second-conductive-type shallow well region and which serves for changing a substrate bias of the first-conductive-type field effect transistor; and the second-conductive-type circuit block comprising: the first-conductive-type second-deepest well region formed on the second-conductive-type first-deepest well region; the first-conductive-type shallow well region formed on the first-conductive-type second-deepest well region; the second-conductive-type field effect transistor formed on the first-conductive-type shallow well region; and the input terminal which is formed on the first-conductive-type shallow well region and which serves for changing a substrate bias of the second-conductive-type field effect transistor.

According to this embodiment, a plurality of circuit blocks composed of the first-conductive-type substrate-bias variable transistors, and those circuit blocks can respectively be put into the standby state or the active state as required. Furthermore, a plurality of circuit blocks composed of the second-conductive-type substrate-bias variable transistors are provided, and those circuit blocks can respectively be put into the standby state or the active state as required.

In one embodiment, a complementary circuit is made up by the first-conductive-type dynamic threshold transistor and the second-conductive-type dynamic threshold transistor, or by the first-conductive-type field effect transistor and the second-conductive-type field effect transistor, or by the first-conductive-type dynamic threshold transistor and the second-conductive-type field effect transistor, or by the first-conductive-type field effect transistor and the second-conductive-type dynamic threshold transistor.

According to this embodiment, since a complementary circuit is made up, the power consumption can even further be reduced.

In one embodiment, the device isolation regions are of at least two kinds of widths, and wherein given a width A of the device isolation region of which the shallow well region placed on one side is of the first conductive type, the shallow well region placed on the other side is of the second conductive type, the second-deepest well region placed on the one side is of the second conductive type, and the second-deepest well region placed on the other side is of the first conductive type, given a width B of the device isolation regions of which shallow well regions placed on both sides are of an identical conductive type and second-deepest well regions placed on both sides are of different conductive types, and given a width C of the device isolation region of which shallow well regions placed on both sides are of an identical conductive type and second-deepest well regions placed on both sides are of an identical conductive type, then A>C and B>C.

According to this embodiment, device isolation regions of large widths A and B, as well as a device isolation region of a narrow width C are provided, and the device isolation regions of the large widths A and B are provided where the shallow well region differs in conductive type between the two sides of the device isolation region or where the second-deepest well region differs in conductive type therebetween. Therefore, punch-throughs between well regions and threshold shifts of devices due to dopant diffusion can be suppressed. Moreover, since the width C of the device isolation region is set narrower where the well regions on both sides are of an identical conductive type, the margin between the devices can be reduced.

In a second aspect of the present invention, there is provided a semiconductor device comprising:

a semiconductor substrate;

a first-conductive-type deep well region formed in the semiconductor substrate;

a first first-conductive-type shallow well region formed on the first-conductive-type deep well region;

a second-conductive-type deep well region formed on the first-conductive-type deep well region;

a first second-conductive-type shallow well region formed on the first-conductive-type deep well region;

a first-conductive-type dynamic threshold transistor which is formed on the first second-conductive-type shallow well region and in which a gate electrode and the first second-conductive-type shallow well region are electrically connected to each other;

a second second-conductive-type shallow well region formed on the second-conductive-type deep well region;

a first-conductive-type field effect transistor formed on the second second-conductive-type shallow well region; and device isolation regions which are deeper than a depth of a junction between the first-conductive-type deep well region and the second-conductive-type shallow well region and which are shallower than a depth of a junction between the first-conductive-type deep well region and the second-conductive-type deep well region, and further which has at least two kinds of widths, wherein given a width B of the device isolation regions of which shallow well regions placed on both sides are of an identical conductive type and deep well regions placed on both sides are of different conductive types, and given a width C of the device isolation region of which shallow well regions placed on both sides are of an identical conductive type and deep well regions placed on both sides are of an identical conductive type, then

B>C.

Further, a semiconductor device of one embodiment comprises:

a semiconductor substrate;

a first-conductive-type deep well region formed in the semiconductor substrate;

a first first-conductive-type shallow well region formed on the first-conductive-type deep well region;

a second-conductive-type field effect transistor formed on the first first-conductive-type shallow well region;

a first second-conductive-type shallow well region formed on the first-conductive-type deep well region;

a first-conductive-type dynamic threshold transistor which is formed on the first second-conductive-type shallow well region and in which a gate electrode and the second-conductive-type shallow well region are electrically connected to each other;

a second-conductive-type deep well region formed on the first-conductive-type deep well region;

a second second-conductive-type shallow well region formed on the second-conductive-type deep well region;

a first-conductive-type field effect transistor formed on the second second-conductive-type shallow well region;

a second first-conductive-type shallow well region formed on the second-conductive-type deep well region;

a second-conductive-type dynamic threshold transistor which is formed on the second first-conductive-type shallow well region and in which a gate electrode and the second first-conductive-type shallow well region are electrically connected to each other; and device isolation regions which are deeper than a depth of a junction between the first-conductive-type deep well region and the first second-conductive-type shallow well region and than a depth of a junction between the second-conductive-type deep well region and the second first-conductive-type shallow well region and which are shallower than a depth of a junction between the first-conductive-type deep well region and the second-conductive-type deep well region, and further which has at least two kinds of widths, wherein given a width A of the device isolation region of which a shallow well region placed on one side is of the first conductive type, a shallow well region placed on the other side is of the second conductive type, a deep well region placed on the one side is of the second conductive type, and a deep well region placed on the other side is of the first conductive type, given a width B of the device isolation regions of which shallow well regions placed on both sides are of an identical conductive type and deep well regions placed on both sides are of different conductive types, and given a width C of the device isolation region of which shallow well regions placed on both sides are of an identical conductive type and deep well regions placed on both sides are of an identical conductive type, then A>C and B>C.

According to this embodiment, device isolation regions of large widths A and B as well as a device isolation region of a narrow width C are provided, and the device isolation regions of the large widths A and B are provided where the shallow well region differs in conductive type between the two sides of the device isolation region or where the second-deepest well region differs in conductive type therebetween. Therefore, punch-throughs between well regions and threshold shifts of devices due to dopant diffusion can be suppressed. Moreover, since the width C of the device isolation region is set narrower where the well regions on both sides are of an identical conductive type, the margin between the devices can be reduced.

As a result of this, in a semiconductor device having well regions of at least two or more layers, it becomes implementable to suppress punch-throughs between well regions and threshold shifts of devices due to dopant diffusion.

In one embodiment, A=B.

In this case, the number of kinds of the width of the device isolation regions becomes smaller, facilitating the manufacture.

In one embodiment, 0.18 $\mu$m<A<0.7 $\mu$m.

In this case, the margin between the well regions can be made to fall within a permissible range while punch-throughs between the well regions and threshold shifts of the devices due to dopant diffusion are securely suppressed.

In one embodiment, the device isolation regions are formed of STI (Shallow Trench Isolation).

In this embodiment, since the device isolation regions are formed of STI, it becomes easily attainable to form device isolation regions of various widths and therefore to form the semiconductor device.

The portable electronic equipment according to one embodiment includes the above-described semiconductor device.

This portable electronic equipment, by virtue of its including the semiconductor device of less power consumption, is capable of prolonging the battery life to a large extent.

BEST MODE FOR CARRYING OUT THE INVENTION

Hereinbelow, the present invention is described in detail by way of embodiments thereof illustrated in the accompanying drawings.

Semiconductor substrates usable for the present invention, although not particularly limited, are preferably silicon substrates. The semiconductor substrate may have either conductive type, P-type or N-type.

Figure 1:
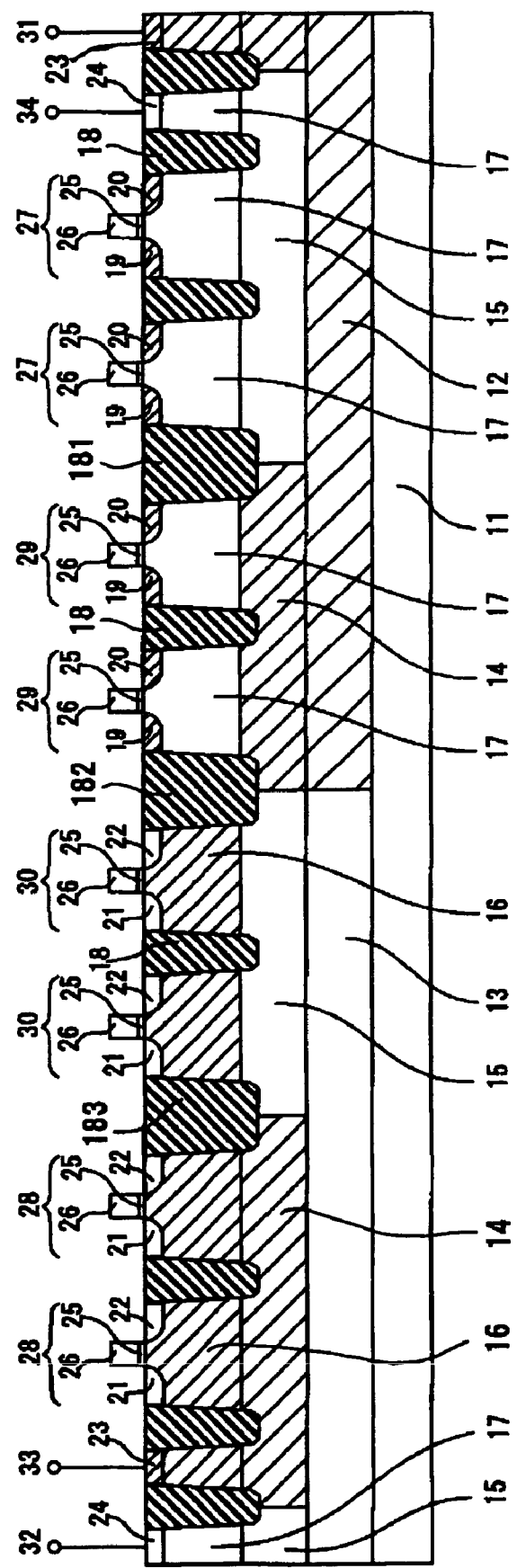
FIG. 1 is a longitudinal sectional view of a semiconductor device according to an embodiment of the invention.
Figure 2:
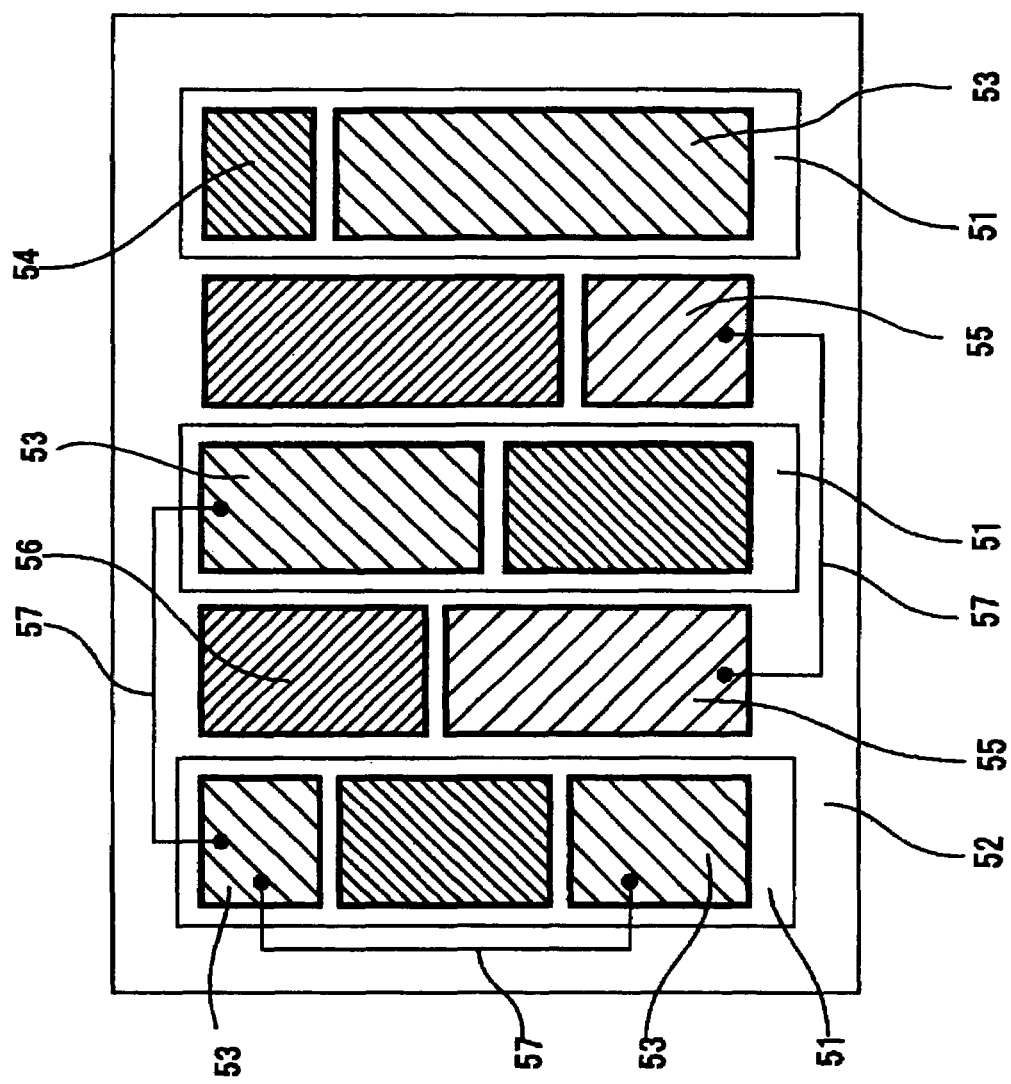
FIG. 2 is a plan view of the semiconductor device of the embodiment.

FIG. 1 is a cross-sectional schematic view of a semiconductor device according to an embodiment of the invention, and FIG. 2 is a plan schematic view of the semiconductor device.

As shown in FIG. 1, in this semiconductor device, an N-type very deep, i.e. first deepest, well region 12 and a P-type very deep, i.e. first deepest, well region 13 are formed in a P-type silicon substrate 11.

An N-type deep, i.e. second deepest, well region 14 is formed in the N-type very deep well region 12. A P-type shallow well region 17 is formed in the N-type deep well region 14. An N-type source region 19 and an N-type drain region 20 are formed in the P-type shallow well region 17. Also, on a channel region between the N-type source region 19 and the N-type drain region 20, a gate electrode 26 is formed via a gate insulator 25, thus forming N-type DTMOS' 29, 29. Although not shown, in the DTMOS 29, the gate electrode 26 and the P-type shallow well region 17 are electrically connected to each other. The device isolation region 18 has enough depth to electrically isolate the P-type shallow well regions 17, 17 of mutually neighboring devices. Accordingly, the P-type shallow well regions 17, 17 of the DTMOS' 29, 29 are electrically isolated from each other. It is noted that the N-type very deep well region 12 is connected to a bias input terminal 31 leading to the N-type very deep, i.e. first deepest, well region 12 via the N-type deep well region 14, an N-type shallow well region 16 and an N-type heavily doped region 23. Normally, the power supply voltage is given to the bias input terminal 31 leading to the N-type very deep well region 12.

Also, a P-type deep, i.e. second deepest, well region 15 is formed in the N-type very deep well region 12. A P-type shallow well region 17 is formed in the P-type deep well region 15. An N-type source region 19 and an N-type drain region 20 are formed in the P-type shallow well region 17. Further, on a channel region between the N-type source region 19 and the N-type drain region 20, a gate electrode 26 is formed via a gate insulator 25, thus forming N-type substrate-bias variable transistors 27, 27. The P-type deep well region 15 and the P-type shallow well region 17 are integrated together, and not isolated by the device isolation region 18. Therefore, the N-type substrate-bias variable transistors 27, 27 share the P-type well regions 15, 17. It is noted that the P-type deep well region 15 and the P-type shallow well region 17 are connected via a P-type heavily doped region 24 to a well-bias input terminal 34 leading to the N-type substrate-bias variable transistors 27. To the well-bias input terminal 34 leading to the N-type substrate-bias variable transistors 27, 27, a 0 V or positive voltage in an active state or a negative voltage in a standby state is applied from an unshown bias generation circuit.

A P-type deep, i.e. second deepest, well region 15 is formed in the P-type very deep, i.e. first deepest, well region 13. An N-type shallow well region 16 is formed in the P-type deep well region 15. A P-type source region 21 and a P-type drain region 22 are formed in the N-type shallow well region 16. Also, on a channel region between the P-type source region 21 and the P-type drain region 22, a gate electrode 26 is formed via a gate insulator 25, thus forming P-type DTMOS' 30. Although not shown, in the DTMOS 30, the gate electrode 26 and the N-type shallow well region 16 are electrically connected to each other. The device isolation region 18 has enough depth to electrically isolate the N-type shallow well regions 16, 16 of mutually neighboring devices. Accordingly, the N-type shallow well regions 16 of the respective DTMOS' 30 are electrically isolated from each other. It is noted that the P-type very deep, i.e. first deepest, well region 13 is connected to a bias input terminal 32 leading to the P-type very deep well region 13 via the P-type deep, i.e. second deepest, well region 15, and the P-type shallow well region 17 and a P-type heavily doped region 24. Normally, 0 V is given to the bias input terminal 32 leading to the P-type very deep well region 13.

Also, an N-type deep, i.e. second deepest, well region 14 is formed in the P-type very deep well region 13. An N-type shallow well region 16 is formed in the N-type deep well region 14. A P-type source region 21 and a P-type drain region 22 are formed in the N-type shallow well region 16. Further, on a channel region between the P-type source region 21 and the P-type drain region 22, a gate electrode 26 is formed via a gate insulator 25, thus forming P-type substrate-bias variable transistors 28. The N-type deep well region 14 and the N-type shallow well region 16 are integrated together, and not isolated by the device isolation region 18. Therefore, the P-type substrate-bias variable transistors 28 share the N-type deep well regions 14, 16. It is noted that the N-type deep well region 14 and the N-type shallow well region 16 are connected via an N-type heavily doped region 23 to a well-bias input terminal 33 leading to the P-type substrate-bias variable transistors 28. To the well-bias input terminal 33 leading to the P-type substrate-bias variable transistors 28, the power supply voltage or a voltage lower than the power supply voltage in an active state or a voltage higher than the power supply voltage in a standby state is applied from an unshown bias generation circuit (where it is assumed that the source voltage of an NMOS is 0 V and the source voltage of a PMOS is the power supply voltage).

Next, the semiconductor device of this embodiment is described with reference to FIG. 2. It is noted that individual interconnects or bias generation circuits to make up the circuit are omitted in FIG. 2. On a semiconductor substrate are a region 51 over which an N-type very deep well region is formed and a region 52 over which a P-type very deep well region is formed. Within the region 51 over which an N-type very deep well region is formed, a block 53 composed of N-type substrate-bias variable transistors and a block 54 composed of N-type DTMOS' are formed. Within the region 52 over which a P-type very deep well region is formed, a block 55 composed of P-type substrate-bias variable transistors and a block 56 composed of P-type DTMOS' are formed.

The block 53 composed of N-type substrate-bias variable transistors may also be connected to another block 53 composed of N-type substrate-bias variable transistors by an upper interconnect 57 that connects together common well regions of the substrate-bias variable transistors. The plurality of blocks 53, 53 composed of N-type substrate-bias variable transistors and connected to each other in this way function as one circuit block composed of N-type substrate-bias variable transistors. To the common well region of this circuit block, a 0 V or positive voltage is given in an active state and a negative voltage is given in a standby state, from an unshown bias generation circuit.

The block 55 composed of P-type substrate-bias variable transistors may also be connected to another block 55 composed of P-type substrate-bias variable transistors by an upper interconnect 57 that connects together common well regions of the substrate-bias variable transistors. The blocks 55, 55 composed of P-type substrate-bias variable transistors and connected to each other in this way function as one circuit block composed of P-type substrate-bias variable transistors. To the common well region of this circuit block, the power supply voltage or a voltage lower than the power supply voltage is given in an active state and a voltage higher than the power supply voltage is given in a standby state, from an unshown bias generation circuit.

With the use of the well structure shown in FIG. 1 and further with an arrangement shown in FIG. 2, a plurality of circuit blocks of substrate-bias variable transistors can easily be formed in a circuit in which substrate-bias variable transistors and DTMOS' are mixedly contained. Furthermore, complementary (CMOS) circuits can be made up by connecting N-type devices and P-type devices with the upper interconnects.

Next, the procedure for fabricating the above-described semiconductor device is described with reference to FIGS. 1 and 2.

First, device isolation regions 18, 181, 182, 183 are formed on a semiconductor substrate 11. The device isolation regions 18, 181, 182, 183 can be formed by using, for example, STI (Shallow Trench Isolation) process. Using the STI process makes it easy to form device isolation regions of various widths simultaneously. However, the method for forming the device isolation regions 18, 181, 182, 183, not being limited to the STI process, needs only to have a function that the device isolation regions 18, 181, 182, 183 isolate the shallow well region. For example, the substance to be filled in the device isolation regions 18, 181, 182, 183 may be not only silicon oxide or silicon nitride but also polysilicon, amorphous silicon or other electrically conductive substances. However, when polysilicon, amorphous silicon or other electrically conductive substance is filled, it is necessary to ensure non-conductivity of the device isolation regions 18, 181, 182, 183 by, for example, preliminarily oxidizing side walls of the device isolation regions 18, 181, 182, 183.

The depth of the device isolation regions 18, 181, 182, 183 is set to such a level that the shallow well regions 16, 17 of mutually neighboring devices are electrically isolated and that their deep well regions 14, 15 are not electrically isolated. The depth of the device isolation regions 18, 181, 182, 183 is preferably, 0.2 to 2 $\mu$m, for example.

The width of the device isolation regions 18, 181, 182, 183 is set as follows. As in the case of the device isolation region 181, when the deep well regions 14, 15 differ in conductive type between the two sides of the device isolation region 181, the deep well region 14 on the N-type DTMOS 29 side is N type and the deep well region 15 on the N-type substrate-bias variable transistor 27 side is P type, for example, at the boundary between the N-type DTMOS 29 and the N-type substrate-bias variable transistor 27. In this case, there arises a problem of punch-through between the P-type shallow well region 17 of the N-type DTMOS 29 and the P-type deep well region 15 of the N-type substrate-bias variable transistor 27. Further, there is a possibility that dopants contained in the N-type deep well regions 14 of the N-type DTMOS' 29 may be diffused, causing the threshold of the N-type substrate-bias variable transistors 27 to change. Another example is the boundary between the N-type DTMOS 29 and the P-type DTMOS 30, where similar problems may occur. In this case, between the two sides of the device isolation region 182 placed at the boundary, the shallow well regions 16, 17 are opposite in conductive type and moreover the deep well regions 15 and 14 are also opposite in conductive type. Otherwise, similar problems may occur further at the boundary between the P-type DTMOS 30 and the P-type substrate-bias variable transistor 28, the boundary between the P-type DTMOS 30 and the N-type substrate-bias variable transistor 27, the boundary between the N-type DTMOS 29 and the P-type substrate-bias variable transistor 28, and the boundary between the N-type substrate-bias variable transistor 27 and the P-type substrate-bias variable transistor 28. Therefore, when the deep well regions 14, 15 are opposite in conductive type between the two sides of the device isolation regions 181, 183, and when the shallow well regions 16, 17 are opposite in conductive type between the two sides of the device isolation region 182 and moreover the deep well regions 14, 15 are also opposite in conductive type, the width of the device isolation regions 181, 182, 183 need to be wide to such an extent that neither the aforementioned punch-through nor changes in threshold occur. For example, even if the dopant injection range for the deep well regions are set as shallow as about 0.3 $\mu$m, the dopants would spread also laterally in injection process, and moreover diffused further laterally due to subsequent thermal diffusion. Even under the injection conditions described above, it was impossible to suppress changes in threshold when the width of the device isolation region was less than 0.18 $\mu$m. Also, with the width of the device isolation region not less than 0.7 $\mu$m, the margin required for device isolation would be no longer negligible. Accordingly, for prevention of occurrence of the punch-through and changes in threshold, the width of the device isolation regions 181, 182, 183 is preferably 0.18 $\mu$m to 0.7 $\mu$m. When the shallow well region 16 or 17 is identical in conductive type between the two sides of the device isolation region 18 and moreover the deep well region 14 or 15 is identical in conductive type (where the shallow well regions 16, 17 and the deep well regions may be different in conductive type), smaller widths of the device isolation region 18 allow the margin to be reduced. Therefore, the width is set near machining limitations. In this case, the width of the device isolation region 18 may be set to, for example, 0.05 to 0.35 $\mu$m.

Accordingly, assuming that the width of the device isolation region 182 is A, the width of the device isolation region 181, 183 is B and the width of the device isolation region 18 is C, then A=B>C. However, the device isolation regions 181, 182, 183 may be different in width thereamong.

Next, the procedure for fabricating the wells in the semiconductor substrate 11 is described with reference to FIGS. 3 to 8.

Figure 3:
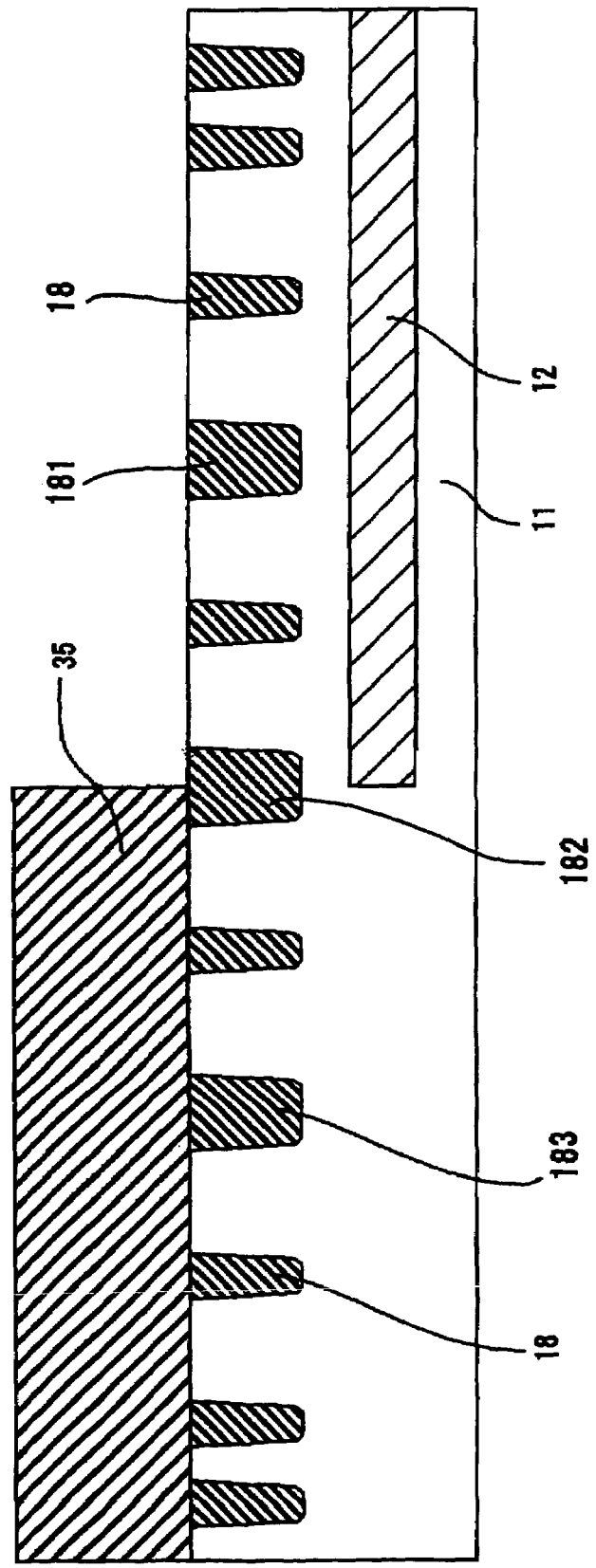
FIG. 3 is a view for explaining the method of manufacturing the semiconductor device of the embodiment.

As shown in FIG. 3, with photoresist 35 used as a mask, the N-type very deep well region 12 is formed on the semiconductor substrate 11. An example of dopant ions that give the N type is $^{31}P^+$. For example, when $^{31}P^+$ is used as dopant ions, the well region can be formed under the conditions of an injection energy of 500 to 3000 keV and an injection quantity of $5\times10^{11}$ to $1\times10^{14}$ cm$^{-2}$.

Figure 4:
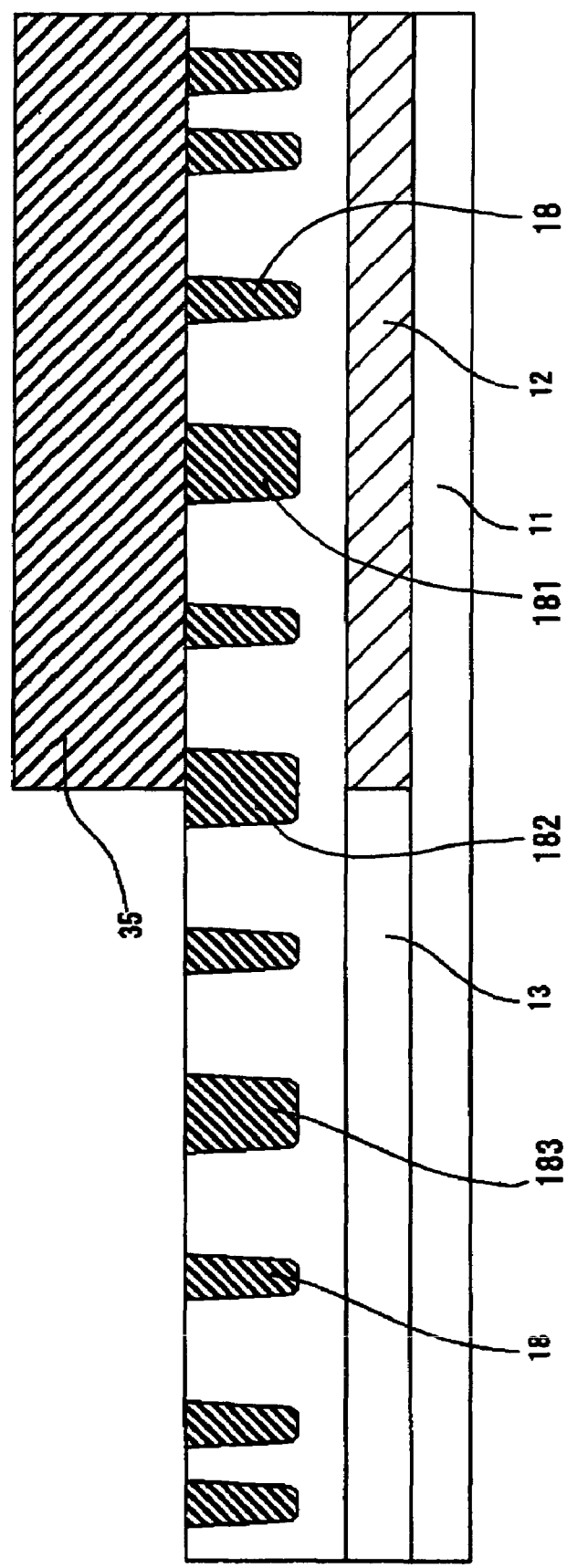
FIG. 4 is a view for explaining the method of manufacturing the semiconductor device of the embodiment.

Next, as shown in FIG. 4, with photoresist 35 used as a mask, the P-type very deep well region 13 is formed. An example of dopant ions that give the P type is $^{11}B^+$. For example, when $^{11}B^+$ ions are used as dopant ions, the well region can be formed under the conditions of an injection energy of 200 to 2000 keV and an injection quantity of $5\times10^{11}$ to $1\times10^{14}$ cm$^{-2}$.

Figure 5:
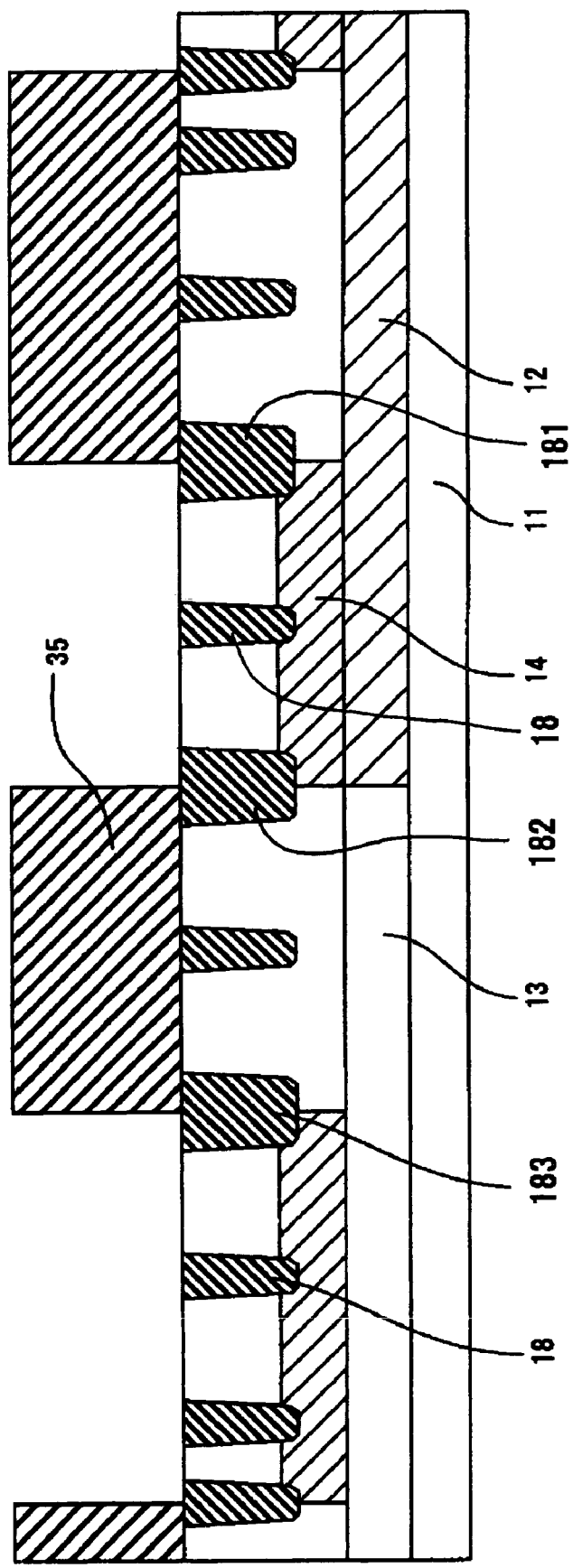
FIG. 5 is a view for explaining the method of manufacturing the semiconductor device of the embodiment.

Next, as shown in FIG. 5, with the photoresist 35 used as a mask, the N-type deep well region 14 is formed. An example of dopant ions that give the N type $^{31}P^+$. For example, when $^{31}P^+$ is used as dopant ions, the well region can be formed under the conditions of an injection energy of 240 to 1500 keV and an injection quantity of $5\times10^{11}$ to $1\times10^{14}$ cm$^{-2}$.

Figure 6:
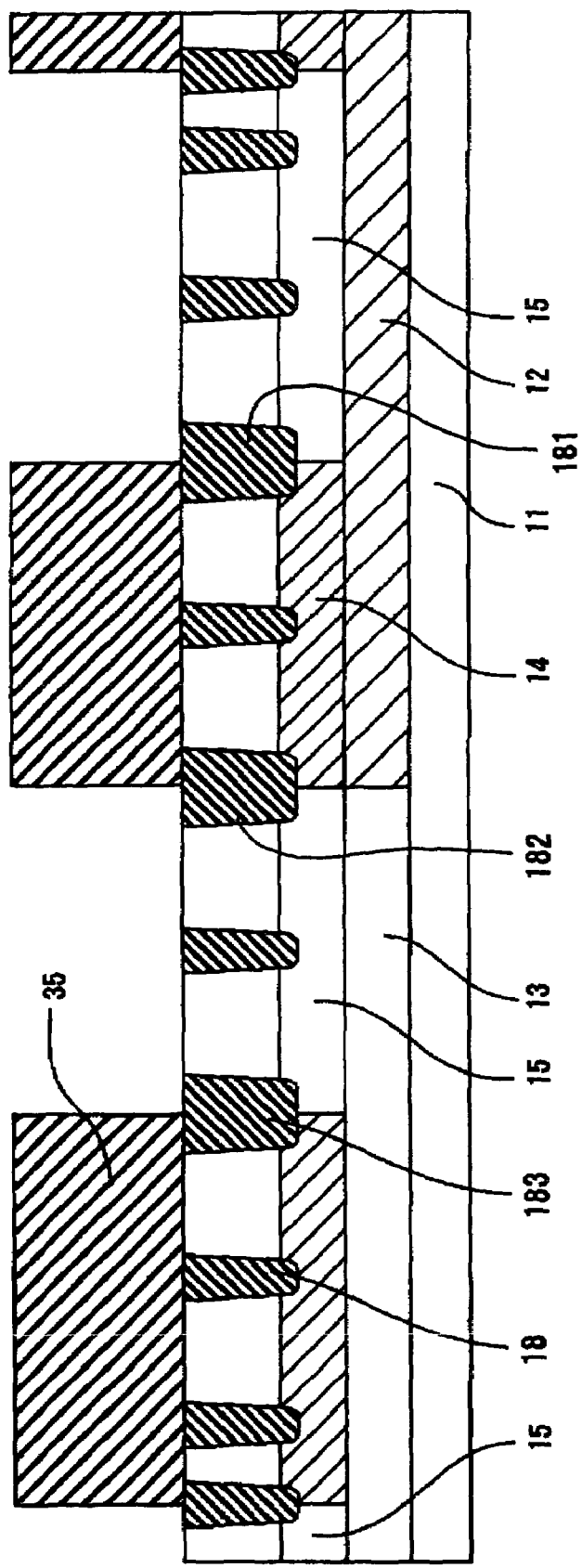
FIG. 6 is a view for explaining the method of manufacturing the semiconductor device of the embodiment.

Next, as shown in FIG. 6, with the photoresist 35 used as a mask, the P-type deep well region 15 is formed. An example of dopant ions that give the P type is $^{11}B^+$. For example, when $^{11}B^+$ ions are used as dopant ions, the well region can be formed under the conditions of an injection energy of 100 to 1000 keV and an injection quantity of $5\times10^{11}$ to $1\times10^{14}$ cm$^{-2}$.

Figure 7:
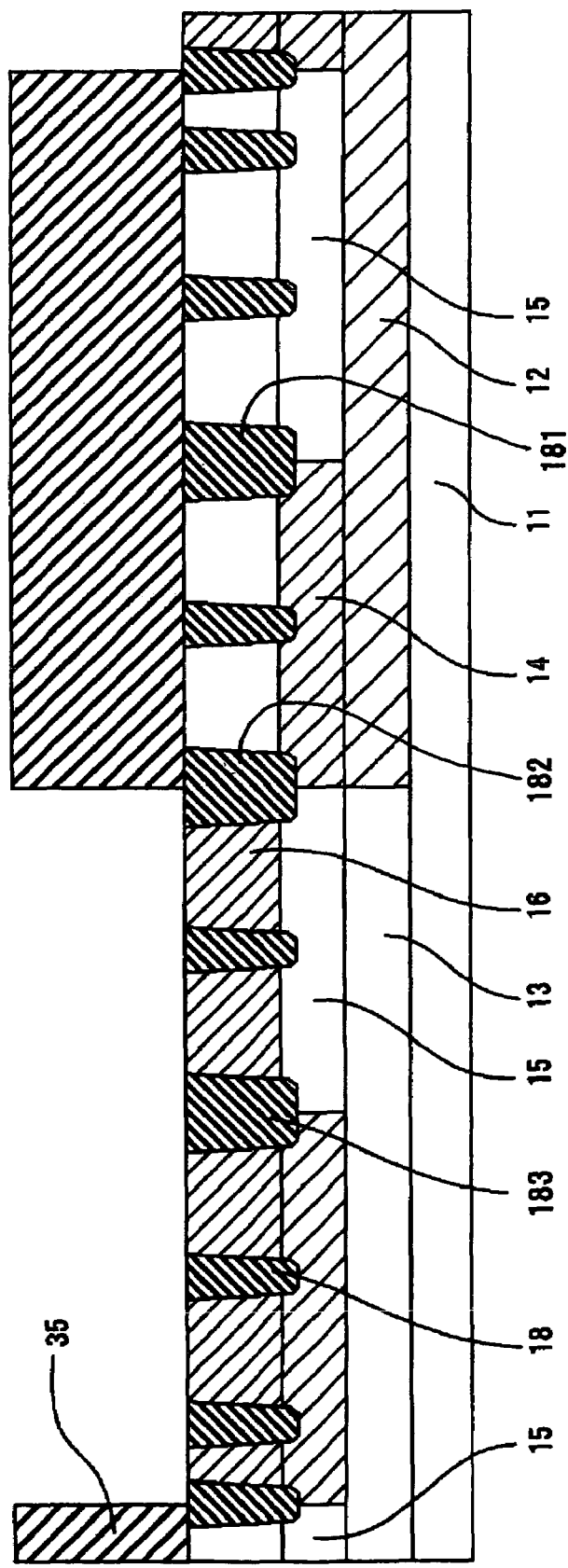
FIG. 7 is a view for explaining the method of manufacturing the semiconductor device of the embodiment.

Next, as shown in FIG. 7, with the photoresist 35 used as a mask, the N-type shallow well region 16 is formed. An example of dopant ions that give the N type is $^{31}P^+$. For example, when $^{31}P^+$ is used as dopant ions, the well region can be formed under the conditions of an injection energy of 130 to 900 keV and an injection quantity of $5\times10^1$ to $1\times10^{14}$ cm$^{-2}$.

Figure 8:
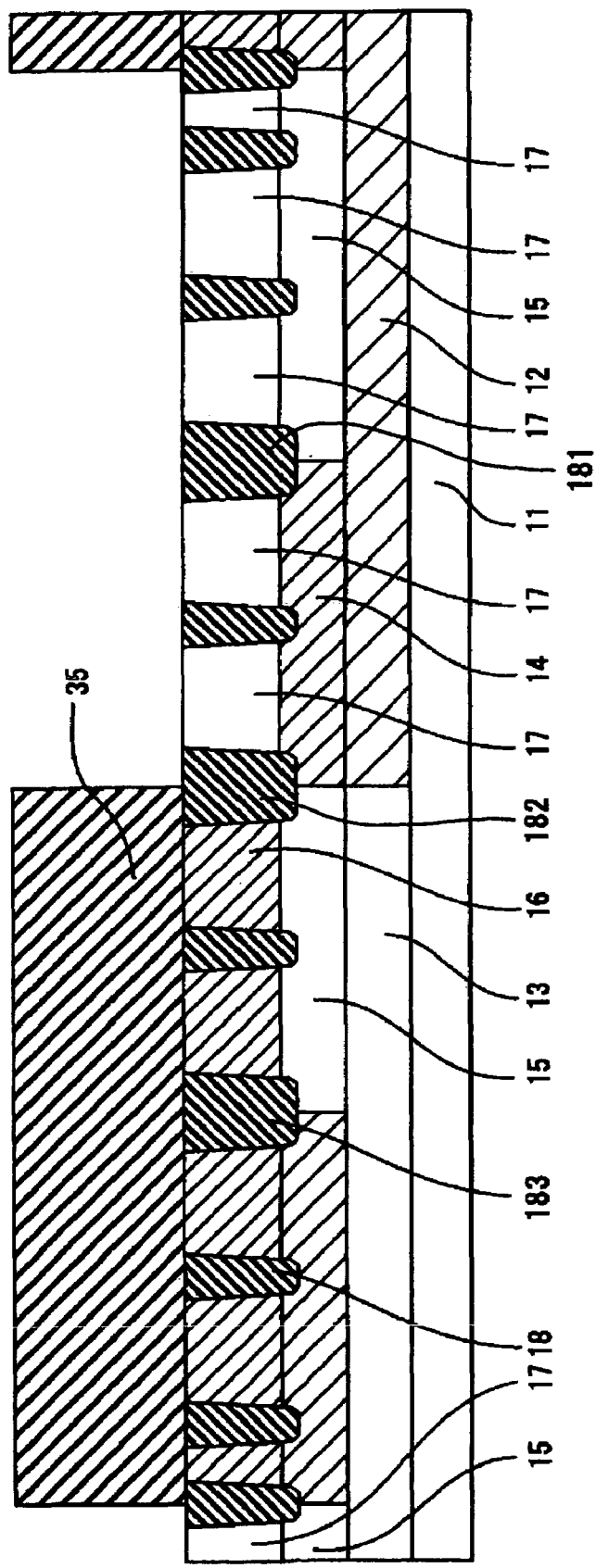
FIG. 8 is a view for explaining the method of manufacturing the semiconductor device of the embodiment.

Next, as shown in FIG. 8, with the photoresist 35 used as a mask, the P-type shallow well region 17 is formed. An example of dopant ions that give the P type is $^{11}B^+$. For example, when $^{11}B^+$ ions are used as dopant ions, the well region can be formed under the conditions of an injection energy of 60 to 500 keV and an injection quantity of $5\times10^{11}$ to $1\times10^{14}$ cm$^{-2}$.

The order of dopant injection for forming the well regions is not limited to the above-described one, and may be changed.

It is noted that the depth of the junction between the shallow well regions 16, 17 and the deep well regions 14, 15 as well as the depth of the junction between the deep well regions 14, 15 and the very deep well regions 12, 13 are determined according to the injection conditions of dopants for the shallow well regions 16, 17, the injection conditions of dopants for the deep well regions 14, 15, the injection conditions of dopants for the very deep well regions 12, 13 and the thermal processes to be performed afterwards. The depth of the device isolation regions device isolation regions 18, 181, 182, 183 is set to such a level that the shallow well regions 16, 17 of neighboring devices are electrically isolated and that the deep well regions 14, 15 are not electrically isolated.

Furthermore, for reduction of resistance of the shallow well regions 16, 17, heavily doped buried regions of the same conductive type as the dopant ions of the shallow well regions 16, 17 may be formed in the shallow well regions. Reduced resistance of the shallow well regions 16, 17 allows an input to the gate electrode 26 to be promptly propagated to the shallow well regions 16, 17, making it possible to obtain the full substrate-bias effect so that higher-speed operations of the DTMOS' 29, 30 can be implemented. The heavily doped buried regions can be formed under the conditions of, for example, dopant ions of $^{11}$B$^+$, an injection energy of 100 to 400 keV and an injection quantity of $1\times10^{12}$ to $1\times10^{14}$ cm$^{-2}$ for the formation in the P-type shallow well region 17, or conditions of dopant ions of $^{31}$P$^+$, an injection energy of 240 to 750 keV and an injection quantity of $1\times10^{12}$ to $1\times10^{14}$ cm$^{-2}$ for the formation in the N-type shallow well region 16.

Further, in order to prevent the dopant level from being excessively lightened in the substrate surface region, dopant ions of the same conductive type as the dopant ions of the shallow well regions 16, 17 may also be injected as a punch-through stopper injection into the shallow well regions 16, 17. The punch-through stopper injection can be carried out, for example, under the conditions of dopant ions of $^{11}$B$^+$, an injection energy of 10 to 60 keV and an injection quantity of $5\times10^{11}$ to $1\times10^{13}$ cm$^{-2}$ for the formation in the P-type shallow well region 17, or conditions of dopant ions of $^{31}$P$^+$, an injection energy of 30 to 150 keV and an injection quantity of $5\times10_{11}$ to $1\times10^{13}$ cm$^{-2}$ for the formation in the N-type shallow well region 16.

Next, the gate insulator 25 and the gate electrode 26 shown in FIG. 1 are formed in this order.

Material of the gate insulator 25 is not particularly limited as far as it has insulation property. For this purpose, when a silicon substrate is used, silicon oxide, silicon nitride or a laminate of those may be used. Further, high-permittivity films of aluminum oxide, titanium oxide, tantalum oxide or the like or their laminates may also be used. Preferably, the gate insulator 25 has a thickness of 1 to 10 nm in the case where silicon oxide is used. The gate insulator 25 can be formed by CVD (Chemical Vapor Deposition) process, sputtering process, thermal oxidation or other like process.

Next, material of the gate electrode 26 is not particularly limited as far as it has electrical conductivity. For this purpose, when a silicon substrate is used, silicon films of polysilicon, single crystal silicon or the like may be mentioned as examples. Further, in addition to these, metal films of aluminum, copper or the like are available. Preferably, the gate electrode has a thickness of 0.1 to 0.4 μm. The gate electrode can be formed by CVD process, evaporation process or other like process.

Further, a side wall spacer may be formed on the side wall of the gate electrode 26. Material of this side wall spacer is not particularly limited as far as it is an insulating film, and exemplified by silicon oxide, silicon nitride and the like.

Next, in the DTMOS' 29, 30, although not shown, a gate-substrate connection region is formed. In regions other than the source regions 19, 21, the drain regions 20, 22 and the channel region, for the formation of a gate-substrate connection region for electrically connecting the gate electrode 26 and the shallow well regions 16, 17 to each other, the gate electrode 26 and the gate oxide are partly etched until the ground substrate is exposed. In this exposed region, a heavily doped region (P-type heavily doped region in NMOS', and N-type heavily doped region in PMOS') is formed. In a silicification step to be performed later, the gate electrode 26 and the shallow well regions 16, 17 are electrically connected to each other in the gate-substrate connection region.

Next, source regions (NMOS source region 19 and PMOS source region 21) and drain regions (NMOS drain region 20 and PMOS drain region 22) of a conductive type opposite to the conductive type of the shallow well regions 17, 16 are formed on the surface layer of the shallow well regions 17, 16.

The source regions 19, 21 and the drain regions 20, 22 can be formed in self-alignment fashion, for example, by injecting dopant ions of a conductive type opposite to the conductive type of the shallow well regions 17, 16 with the gate electrode 26 used as a mask. The source regions 19, 21 and the drain regions 20, 22 can be formed, for example, under the conditions of an injection energy of 3 to 100 keV and an injection quantity of $1\times10^{15}$ to $1\times10^{16}$ cm$^{-2}$ for the case where $^{75}$As$^+$ ions are used as dopant ions, or conditions of an injection energy of 1 to 20 keV and an injection quantity of $1\times10^{15}$ to $1\times10^{16}$ cm$^{-2}$ for the case where $^{11}$B$^+$ ions are used as dopant ions. It is noted that the surface layers of the shallow well regions 16, 17 under the gate electrode 26 function as channel regions.

Further, although not shown, the source regions 19, 21 and the drain regions 20, 22 may have an LDD (Lightly Doped Drain) region on their gate electrode 26 side. The LDD region can be formed in self-alignment fashion, for example, by injecting dopant ions of a conductive type opposite to the conductive type of the shallow well regions 16, 17 with the gate electrode 26 used as a mask. In this case, the source regions 19, 21 and the drain regions 20, 22 can be formed in self-alignment fashion by, after the formation of the LDD region, forming the unshown side wall spacer on the side wall of the gate electrode 26 and injecting ions with the gate electrode 26 and the side wall spacer used as masks. The dopant injection for forming the LDD region can be implemented, for example, under the conditions of an injection energy of 3 to 100 keV and an injection quantity of $5\times10^{13}$ to $1\times10^{15}$ cm$^{-2}$ for the case where $^{75}$As$^+$ ions are used as dopant ions, or conditions of an injection energy of 1 to 20 keV and an injection quantity of $1\times10^{13}$ to $5\times10^{14}$ cm$^{-2}$ for the case where $^{11}$B$^+$ ions are used as dopant ions.

In addition, as the dopant ions for forming the source regions 19, 21, the drain regions 20, 22 and the LDD region, it is also possible to use $^{31}$P$^+$ ions, $^{122}$Sb$^+$ ions, $^{115}$In$^+$ ions, $^{49}$BF$_2{}^+$ ions or the like, in addition to the above-mentioned $^{11}$B$^+$ ions and $^{75}$As$^+$ ions.

Further, the source regions 19, 21, the drain regions 20, 22 and the gate electrode 26 have their surface layers silicified with a view to lowering their respective resistances and improving their electrical conductivities with their respective connecting lines. By this silicification, the gate electrode 26 and the shallow well regions 16, 17 are electrically connected to each other in the gate-substrate connection region. The silicide may be given by, for example, tungsten silicide, titanium silicide, or the like.

In addition, although not shown, the source regions and the drain regions may also be provided in a stacking type (see Japanese Patent Laid-Open Publication HEI 2000-82815). In this case, the source regions and the drain regions can be made smaller in area, allowing higher integration to be achieved.

After that, an activation annealing for the dopants is performed. The activation annealing is carried out under such conditions that the dopants are fully activated and moreover prevented from being excessively diffused. For example, in the case where the N-type dopant is $^{75}As^+$ and the P-type dopant is $^{11}B^+$, it is appropriate that after the injection of $^{75}As^+$, an annealing is done at 800 to 1000° C. for about 10 to 100 minutes and subsequently, after the injection of $^{11}B^+$, an annealing is done at 800 to 1000° C. for 10 to 100 seconds. In addition, in order to obtain a gentler dopant profile for the shallow well regions and the deep well regions and the very deep well regions, another annealing may be performed before injecting dopants for the source regions and the drain regions.

After that, interconnecting lines and the like are formed by known techniques, and thus the semiconductor device can be formed.

Although the above description has been made on a case where only the substrate-bias variable transistors 27, 28 and the DTMOS' 29, 30 are involved for explanation's sake, it is also possible that MOSFETs of normal structure are mixed. In this case, the voltage for the shallow well regions may appropriately be fixed for devices that are to be formed into normal MOSFETs.

In the above semiconductor device, the shallow well regions 17, 16 of the DTMOS' 29, 30 are electrically isolated from device to device by the deep well regions 14, 15 of the opposite conductive type and the device isolation region 18. Also, the common well regions of the substrate-bias variable transistors 27, 28 are electrically isolated from circuit block to circuit block by the deep well regions 14, 15 of the opposite conductive type, the very deep well regions 12, 13 of the opposite and the device isolation regions 18, 181, 183. Furthermore, the voltage for the very deep well regions 12, 13 and the deep well regions 14, 15 of the DTMOS' 29, 30 is potentially fixed.

Therefore, according to the semiconductor device of this embodiment, any arbitrary number of circuit blocks of the substrate-bias variable transistors 27, 28 can be formed. As a result of this, it becomes implementable to properly divide the circuit blocks into active-state circuit blocks and standby-state circuit blocks, thus making it possible to reduce the power consumption of the semiconductor device.

Moreover, according to the semiconductor device of this embodiment, the area of the PN junction between the common well of the substrate-bias variable transistors 27, 28 and its neighboring well region of the opposite conductive type can be suppressed to one approximately equally to the area of the circuit block of the substrate-bias variable transistors 27, 28. In contrast to this, the prior-art semiconductor device has a large-area PN junction comparable to the area of the entire substrate. Therefore, in the semiconductor device of this embodiment, quantities of charges and discharges upon changes in the voltage of the common well of the substrate-bias variable transistors 27, 28 are reduced, as compared to the prior art example. As a result of this, the power consumption of the semiconductor device can be reduced.

Furthermore, according to the semiconductor device of this embodiment, since the voltage for the very deep well regions 12, 13 and the deep well regions 14, 15 of the DTMOS' 29, 30 is fixed, it becomes easier to control the latch-up phenomenon. As a result of this, the reliability of the semiconductor device is improved.

It is also possible to make up a CMOS circuit by using the semiconductor device of this embodiment. A CMOS circuit of low power consumption and high speed can be implemented by properly combining respective advantages of the DTMOS' 29, 30, which are capable of obtaining high drive current with low voltage drive, and the substrate-bias variable transistors 27, 28, which are capable of reducing the off-leak current to quiet a small one. Furthermore, when a plurality of circuit blocks of the substrate-bias variable transistors 27, 28 are formed and circuit blocks other than those which should be put into the active state are put into the standby state, the CMOS circuit can be made even lower in power consumption.

Figure 9:
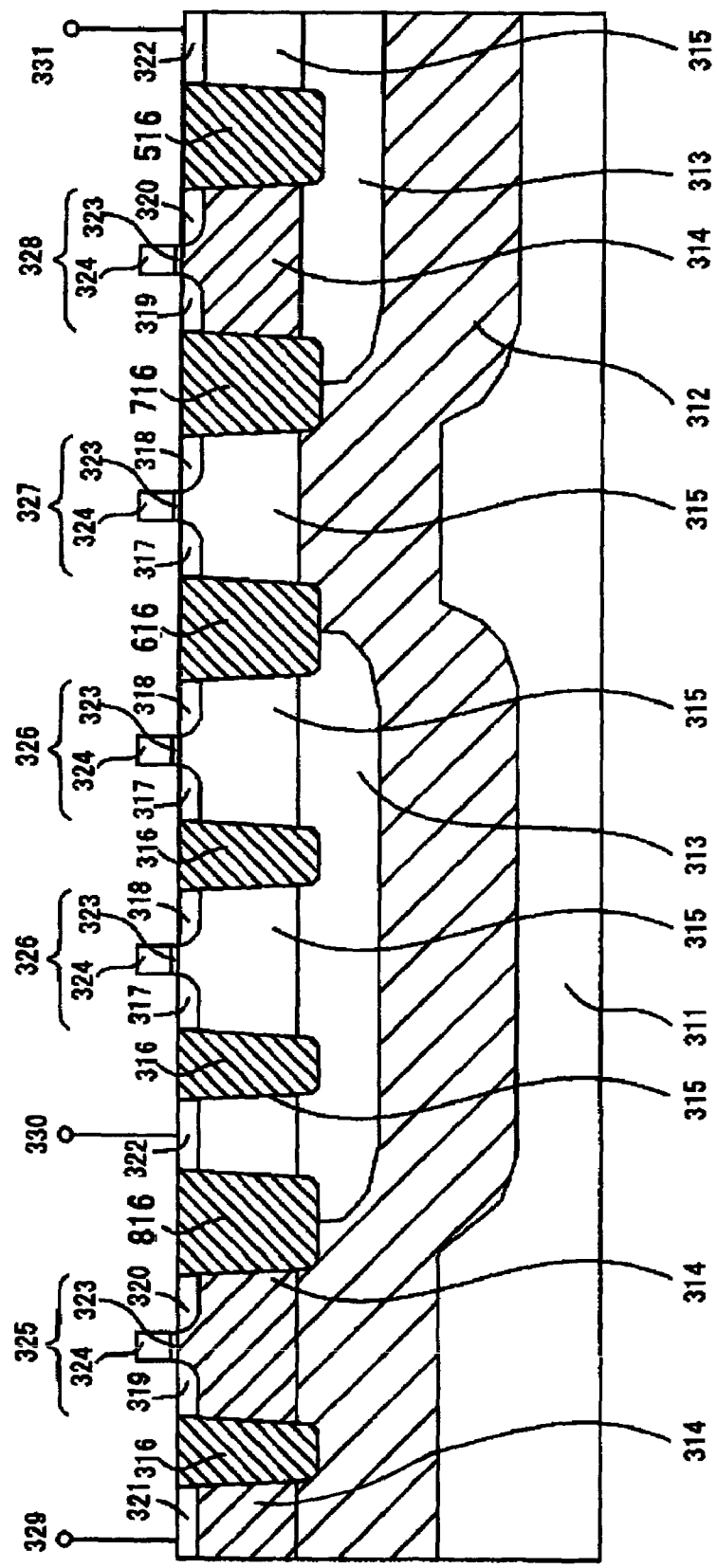
FIG. 9 is a longitudinal sectional view of a semiconductor device according to another embodiment of the invention.
Figure 11:
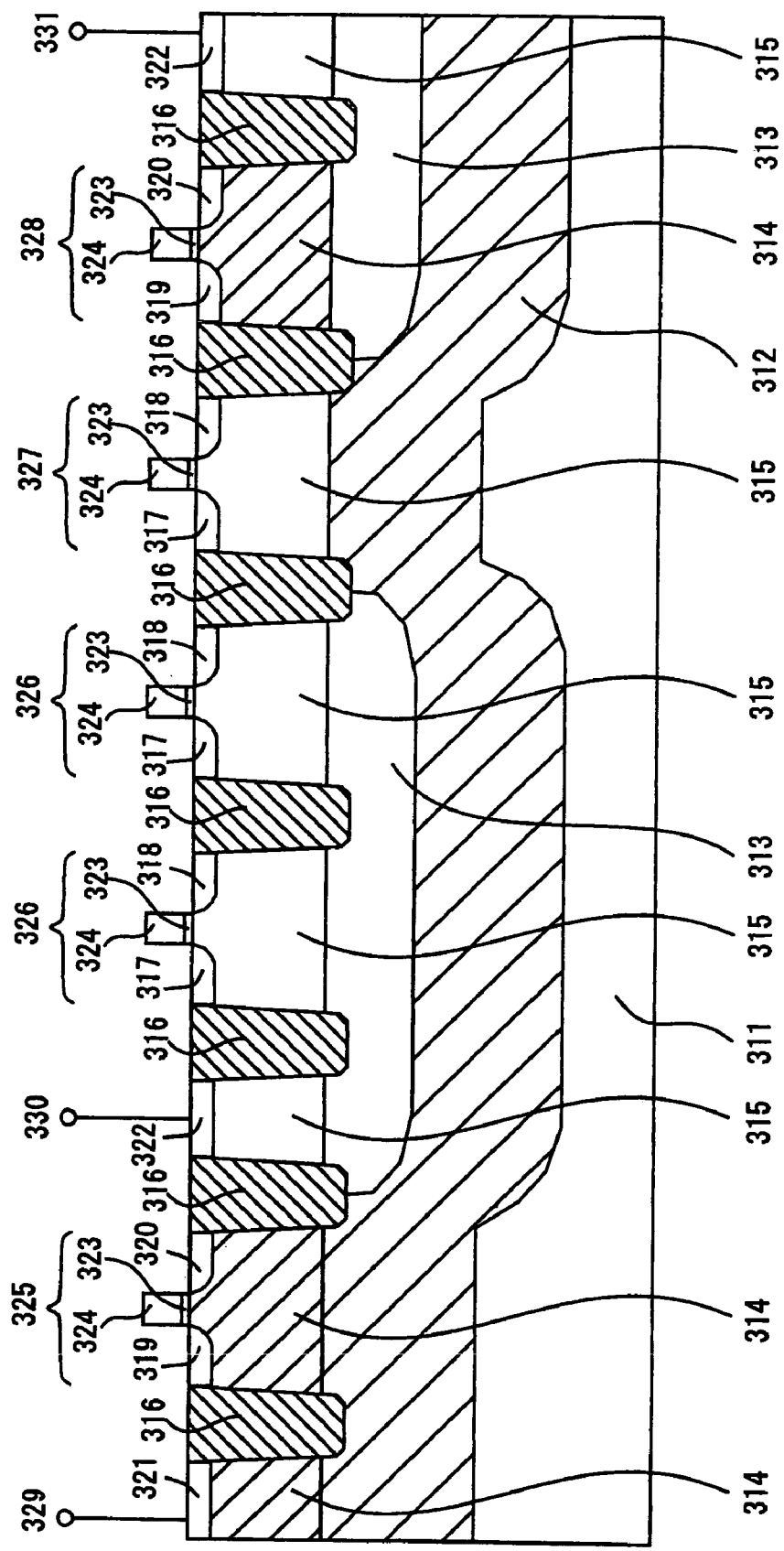
FIG. 11 is a sectional view of a conventional semiconductor device.
Figure 12:
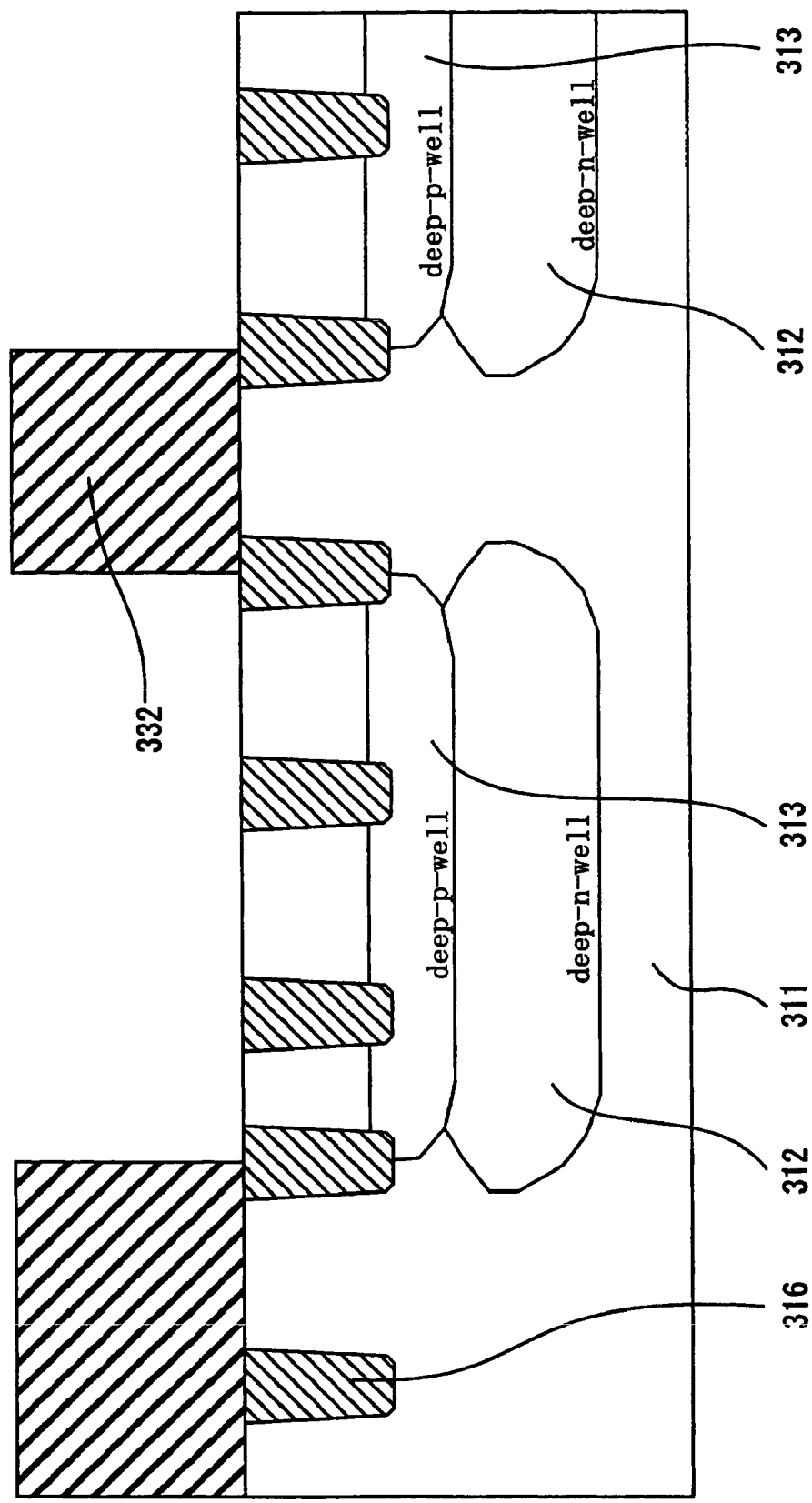
FIG. 12 is a view for explaining the method of manufacturing the conventional semiconductor device.
Figure 13:
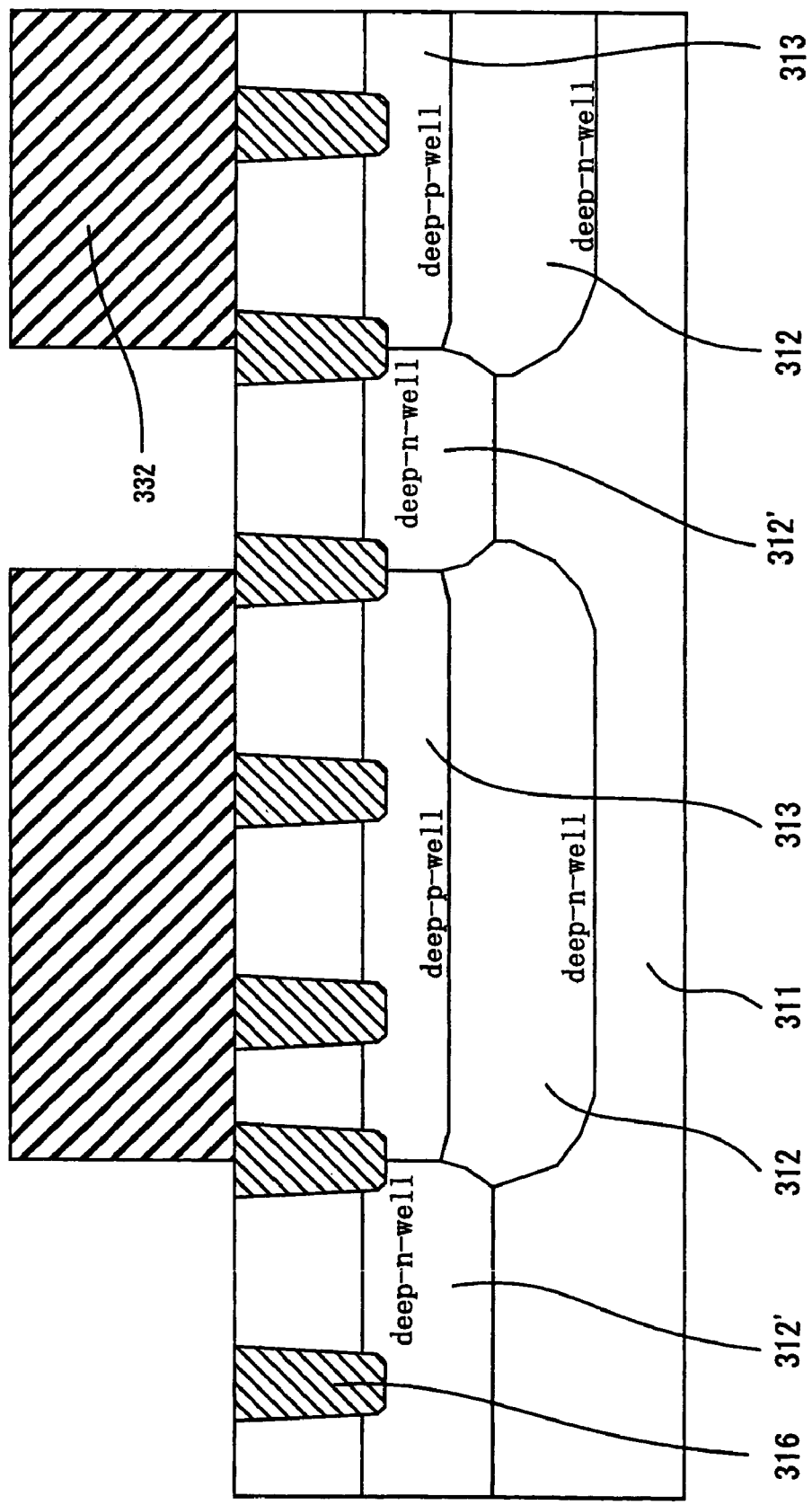
FIG. 13 is a view for explaining the method of manufacturing the conventional semiconductor device.

FIG. 9 is a longitudinal sectional view of a semiconductor device according to another embodiment of the invention. This semiconductor device of FIG. 9 differs from the prior-art semiconductor device shown in FIG. 11 in that a small-width device isolation region 316 and large-width device isolation regions 516, 616, 716, 816 are mixedly contained. Therefore, out of the constituent parts of the semiconductor device of FIG. 9, constituent parts identical to those of the prior-art semiconductor device shown in FIG. 11 are indicated by identical reference numerals and their description is omitted.

On both sides of the small-width device isolation region 316, shallow well regions 314, 315 of the same conductive type are provided, and deep well regions 312, 323 of the same conductive type are provided. On both sides of the large-width device isolation region 516, the shallow well regions 314, 315 are opposite in conductive type, and the deep well region 313 is identical in conductive type. Also, on both sides of the large-width device isolation region 616, the shallow well region 315 is identical in conductive type, and the deep well regions 312, 313 are opposite in conductive type. Also, on both sides of the large-width device isolation regions 716, 816, the shallow well regions 314, 315 are opposite in conductive type, and the deep well regions 312, 313 are opposite in conductive type as well. That is, assuming that the width of the device isolation region 716 is A, the width of the device isolation region 516, 616, 816 is B and the width of the device isolation region 316 is C, then A= B>C. However, the device isolation regions 516, 616, 716, 816 may be different in width thereamong.

As shown above, by providing the large-width device isolation regions 516, 616, 716, 816, punch-throughs and changes in threshold can be prevented.

Figure 10:
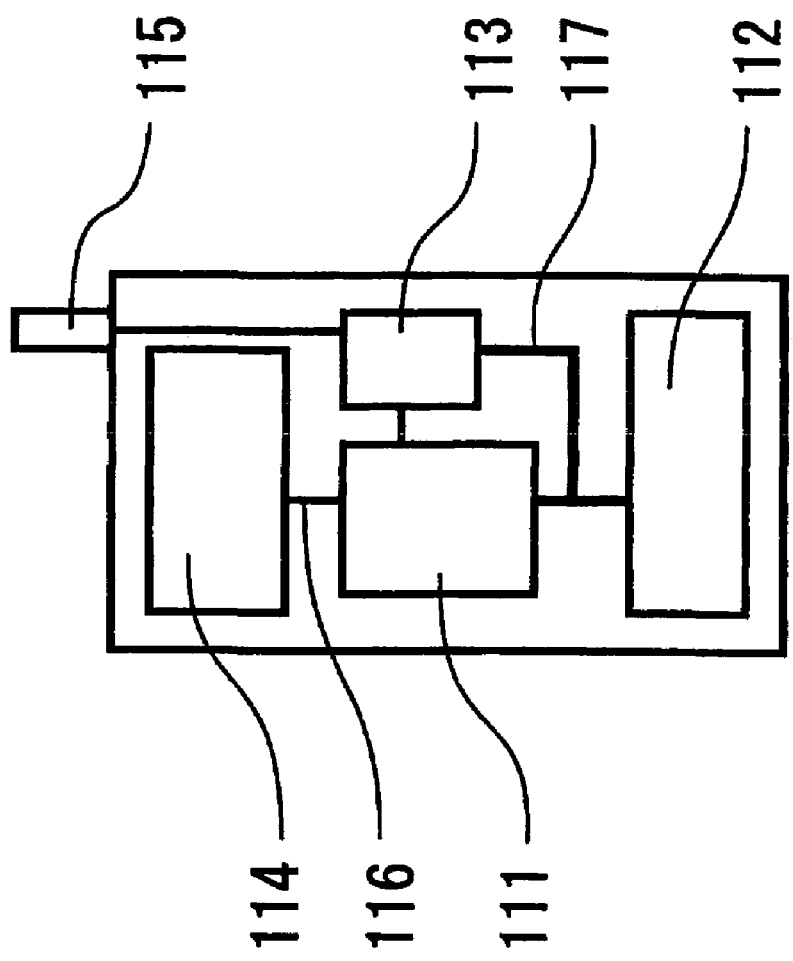
FIG. 10 is a view of portable electronic equipment according to another embodiment of the invention.

Also, the semiconductor device of this embodiment can be incorporated into battery-driven portable electronic equipment. The portable electronic equipment may be exemplified by personal digital assistants, cellular phones, game equipment, and the like. FIG. 10 shows a case where the portable electronic equipment is a cellular phone. A control circuit 111 has a semiconductor device of the present invention incorporated therein. It is noted that the control circuit 111 may also be formed of an LSI (Large-Scale Integrated circuit) on which logic circuits made of the semiconductor device of the invention and memory are mixedly mounted. Reference numeral 112 denotes a battery, 113 denotes an RF (Radio-Frequency) circuit part, 114 denotes a display part, 115 denotes an antenna part, 116 denotes a signal line, and 117 denotes a power supply line. By applying the semiconductor device of the invention to portable electronic equipment, it becomes realizable to lower the power consumption of the LSI part to a large extent while the functions and operating speed of the portable electronic equipment are maintained. As a result of this, the battery life can be prolonged to a large extent.

The semiconductor device of the present invention is a semiconductor device including dynamic threshold transistors and substrate-bias variable transistors, in which a plurality of well regions where substrate-bias variable transistors are provided can be made electrically independent of one another for each of the individual conductive types by using tri-layer well regions and device isolation regions.

Therefore, according to the present invention, an arbitrary number of circuit blocks of substrate-bias variable transistors can be formed for each conductive type, making it possible to properly divide circuit blocks into circuit blocks that should be put into the active state and circuit blocks that should be put into the standby state, so that the power consumption of the semiconductor device can be reduced.

Also, according to the invention, the PN junction area between well regions where substrate-bias variable transistors are provided and well regions of opposite conductive type can be reduced, so that the power consumption of the semiconductor device can be reduced.

Furthermore, since the voltage for the deep well regions of the DTMOS' part can be fixed, it becomes easily attainable to suppress the latch-up phenomenon.

Also, in one embodiment, a semiconductor device having trilayer well regions includes device isolation regions having at least two kinds of widths, where given a width A of the device isolation region of which a shallow well region placed on one side is of the first conductive type, a shallow well region placed on the other side is of the second conductive type, a second-deepest well region placed on the one side is of the second conductive type, and a second-deepest well region placed on the other side is of the first conductive type, given a width B of the device isolation regions of which shallow well regions placed on both sides are of an identical conductive type and second-deepest well regions placed on both sides are of different conductive types, and given a width C of the device isolation region of which shallow well regions placed on both sides are of an identical conductive type and second-deepest well regions placed on both sides are of an identical conductive type, then A>C and B>C. Therefore, even with well regions of a trilayer structure, punch-throughs between well regions and threshold shifts of devices due to dopant diffusion can be suppressed by the device isolation regions of the large widths A and B, and moreover the margin can be reduced by the device isolation region of the narrow width C.

Also, the semiconductor device of the present invention is a semiconductor device having a well structure of at least two or more layers, in which the semiconductor device includes device isolation regions having at least two kinds of widths, where given a width A of the device isolation region of which a shallow well region placed on one side is of the first conductive type, a shallow well region placed on the other side is of the second conductive type, a deep well region placed on the one side is of the second conductive type, and a deep well region placed on the other side is of the first conductive type, given a width B of the device isolation regions of which shallow well regions placed on both sides are of an identical conductive type and deep well regions placed on both sides are of different conductive types, and given a width C of the device isolation region of which shallow well regions placed on both sides are of an identical conductive type and deep well regions placed on both sides are of an identical conductive type, then A>C and B>C. Therefore, punch-throughs between well regions and threshold shifts of devices due to dopant diffusion can be suppressed by the device isolation regions of the large widths A and B, and moreover the margin can be reduced by the device isolation region of the narrow width C.

Also, the portable electronic equipment of the present invention, which uses the above-described semiconductor device, is capable of reducing the power consumption of the LSI part or the like, thus allowing the battery life to be prolonged to a large extent.

What is claimed is:

1. A semiconductor device comprising:
   a semiconductor substrate;
   a first-conductive-type first-deepest well region formed in the semiconductor substrate;
   a first-conductive-type second-deepest well region formed on the first-conductive-type first-deepest well region;
   a second-conductive-type shallow well region formed on the first-conductive-type second-deepest well region;
   a first-conductive-type dynamic threshold transistor which is formed on the second-conductive-type shallow well region and in which a gate electrode and the second-conductive-type shallow well region are electrically connected to each other;
   a second-conductive-type second-deepest well region formed on the first-conductive-type first-deepest well region;
   a second-conductive-type shallow well region formed on the second-conductive-type second-deepest well region;
   a first-conductive-type field effect transistor formed on the second-conductive-type shallow well region;
   an input terminal which is formed on the second-conductive-type shallow well region and which serves for changing a substrate bias of the first-conductive-type field effect transistor;
   a second-conductive-type first-deepest well region formed in the semiconductor substrate;
   a second-conductive-type second-deepest well region formed on the second-conductive-type first-deepest well region;
   a first-conductive-type shallow well region formed on the second-conductive-type second-deepest well region;
   a second-conductive-type dynamic threshold transistor which is formed on the first-conductive-type shallow well region and in which a gate electrode and the first-conductive-type shallow well region are electrically connected to each other;
   a first-conductive-type second-deepest well region formed on the second-conductive-type first-deepest well region;
   a first-conductive-type shallow well region formed on the first-conductive-type second-deepest well region;
   a second-conductive-type field effect transistor formed on the first-conductive-type shallow well region;

an input terminal which is formed on the first-conductive-type shallow well region and which serves for changing a substrate bias of the second-conductive-type field effect transistor;

device isolation regions which are deeper than a depth of a junction between the first-conductive-type second-deepest well region and the second-conductive-type shallow well region and which are shallower than a depth of a junction between the first-conductive-type first-deepest well region and the second-conductive-type second-deepest well region; and device isolation regions which are deeper than a depth of a junction between the second-conductive-type second-deepest well region and the first-conductive-type shallow well region and which are shallower than a depth of a junction between the second-conductive-type first-deepest well region and the first-conductive-type second-deepest well region.

2. The semiconductor device according to claim 1, including in a plural quantity at least either one of a first-conductive-type circuit block or a second-conductive-type circuit block, the first-conductive-type circuit block comprising: the second-conductive-type second-deepest well region s formed on the first-conductive-type first-deepest well region; the second-conductive-type shallow well region formed on the second-conductive-type second-deepest well region; the first-conductive-type field effect transistor formed on the second-conductive-type shallow well region; and the input terminal which is formed on the second-conductive-type shallow well region and which serves for changing a substrate bias of the first-conductive-type field effect transistor; and the second-conductive-type circuit block comprising: the first-conductive-type second-deepest well region formed on the second-conductive-type first-deepest well region; the first-conductive-type shallow well region formed on the first-conductive-type second-deepest well region; the second-conductive-type field effect transistor formed on the first-conductive-type shallow well region; and the input terminal which is formed on the first-conductive-type shallow well region and which serves for changing a substrate bias of the second-conductive-type field effect transistor.

3. The semiconductor device according to claim 1, wherein a complementary circuit is made up by the first-conductive-type dynamic threshold transistor and the second-conductive-type dynamic threshold transistor, or by the first-conductive-type field effect transistor and the second-conductive-type field effect transistor, or by the first-conductive-type dynamic threshold transistor and the second-conductive-type field effect transistor, or by the first-conductive-type field effect transistor and the second-conductive-type dynamic threshold transistor.

4. The semiconductor device according to claim 1, wherein the device isolation regions are of at least two kinds of widths, and wherein given a width A of a first device isolation region of which the shallow well region placed on one side of said first device isolation region is of the first conductive type, the shallow well region placed on the other side of said first device isolation region is of the second conductive type, the second-deepest well region placed on the one side of said first device isolation region is of the second conductive type, and the second-deepest well region placed on the other side of said first device isolation region is of the first conductive type, given a width B of second device isolation regions of which shallow well regions placed on both sides of said second device isolation regions are of an identical conductive type and second-deepest well regions placed on both sides of said second device isolation regions are of different conductive types, and given a width C of a third device isolation region of which shallow well regions placed on both sides of said third device isolation region are of an identical conductive type and second-deepest well regions placed on both sides of said third device isolation region are of an identical conductive type, then $A>C$ and $B>C$.

5. The semiconductor device according to claim 4, wherein A=B.

6. The semiconductor device according to claim 4, wherein 0.18 $\mu$m<A<0.7 $\mu$m.

7. The semiconductor device according to claim 1, wherein the device isolation regions are formed of STI.

8. Portable electronic equipment which includes the semiconductor device as defined in claim 1.

* * * * *